US 6,532,164 B2

(12) United States Patent
Redon et al.

(10) Patent No.: US 6,532,164 B2
(45) Date of Patent: Mar. 11, 2003

(54) MAGNETIC SPIN POLARIZATION AND MAGNETIZATION ROTATION DEVICE WITH MEMORY AND WRITING PROCESS, USING SUCH A DEVICE

(75) Inventors: Olivier Redon, Seyssinet (FR); Bernard Dieny, Lans-en-Vercors (FR); Bernard Rodmacq, Veurey-Voroise (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/990,321

(22) Filed: Nov. 23, 2001

(65) Prior Publication Data

US 2002/0105823 A1 Aug. 8, 2002

(30) Foreign Application Priority Data

Dec. 7, 2000 (FR) .............................................. 00 15893

(51) Int. Cl.⁷ .............................................. G11C 17/02
(52) U.S. Cl. ........................... 365/97; 365/171; 365/173
(58) Field of Search ................................. 365/171, 173, 365/174, 97

(56) References Cited

U.S. PATENT DOCUMENTS 5,856,897 A    1/1999  Mauri
6,178,112 B1 *  1/2001  Bessho et al. .............. 365/171

* cited by examiner

Primary Examiner—Huan Hoang
(74) Attorney, Agent, or Firm—Oblon, Spivak, McClelland, Maier & Neustadt, P.C.

(57) ABSTRACT

A magnetic spin polarizing a magnetization rotation device with a memory and a writing process using such a device. The device is configured to include an apparatus for polarizing the spin of electrons, including a magnetic layer having magnetization perpendicular to the plane of magnetization of respective first and second magnetic layers. The magnetization of the second magnetic layer rotates within a plane, which is either the plane of the layer or a perpendicular plane.

24 Claims, 5 Drawing Sheets

MAGNETIC SPIN POLARIZATION AND MAGNETIZATION ROTATION DEVICE WITH MEMORY AND WRITING PROCESS, USING SUCH A DEVICE

DESCRIPTION

1. Technical Domain

This invention concerns a magnetic spin polarisation and magnetisation rotation device as well as a memory using such a device and a writing process.

It has applications in electronics and in particular for the manufacture of memory cells and MRAM (Magnetic Random Access Memory) type memories or direct access magnetic memories.

2. Previous State of the Technology

MRAM magnetic memories have enjoyed an increase in popularity with the development of magnetic tunnel junctions (MTJ) which exhibit high magneto-resistance at ambient temperature. FIGS. 1A and 1B in the appendix show a schematic representation of the structure and function of such a junction.

The junction is indicated by item 2. It consists of a stack of a layer of oxide sandwiched between two magnetic layers. The system operates like a spin valve, apart from the fact that the current flows perpendicular to the plane of the layers. One of the magnetic layers is described as "free" because its magnetisation may be oriented by an external magnetic field (bi-directional arrow); the other is described as "anchored" because its magnetisation direction is anchored by an anti-ferromagnetic exchange layer (unidirectional arrow). When the magnetisation of the magnetic layers is anti-parallel, the resistance of the junction is high; when the magnetisation is parallel, the resistance is low. The relative variation of the resistance between these two states may be up to 40% by appropriate choice of materials.

Junction (2) is located between a switching transistor (4) and a current supply line (6). The current passing through the latter generates a magnetic field (7). A conductor (8), orthogonal to the current supply line (6) (i.e. in this case perpendicular to the plane of the figure) generates a second magnetic field (9) (located in the plane of the figure).

In "write" mode (FIG. 1A), transistor (4) is blocked. Current flows through the current supply line (6) and the conductor (8). Junction (2) is therefore subjected to two orthogonal magnetic fields. One is applied along the difficult magnetisation axis in the free layer, in order to reduce its reversal field, the other being applied along the easy magnetisation axis in order to generate a reversal of the magnetisation and write in the memory cell. In principle, only the memory cell located at the intersection of lines (6) and (8) is subject to reversal, since each magnetic field taken individually is insufficient to cause reversal of the magnetisation.

In "read" mode (FIG. 1B), the transistor is held in the saturated condition (i.e. the current flowing through it is at a maximum) by a positive current pulse in its base. The current flowing through line (6) only passes through the memory cell whose transistor is open. This current enables the resistance of the junction to be measured. By comparison with a reference memory cell, the state of the memory cell ("0" or "1") may thus be determined.

Such a writing mechanism presents disadvantages particularly within a network of junctions.

1) As the reversal of the free layer magnetisation occurs under the effect of external fields, and since the reversal fields are statistically distributed, it is not impossible to accidentally reverse certain adjacent junctions simply by the effect of the magnetic field produced along the addressing line. As, for high density memories, the size of the memory cells is clearly sub-micronic, the number of addressing errors increases.

2) The reduction in size of memory cells results in an increase in the value of the individual reversal field; a larger current is therefore necessary to write in the memory cells, which tends to increase the electrical power consumption.

3) As writing necessitates two current lines at 90°, the constructional density is consequently limited by the presence of these lines.

4) The writing mode employed only enables writing into one memory cell at a time, if one wishes to minimise the danger of addressing errors.

Recently, other types of magnetic device have appeared, where the magnetic reversal is generated not by external magnetic fields but by electrons passing through the stack perpendicular to the plane of the layers. These devices are described in document U.S. Pat. No. 5,695,864. The mechanism employed is based on the transfer of magnetic moments between the electrons on the one hand, and the free layer magnetisation on the other hand. In such a system, the stack is formed of layers which are all electrically conducting, in order to limit the power dissipation. This results in several disadvantages a) The resistance of the device is so low that a very high current must be injected in order to generate a voltage at the terminals comparable to that in conventional systems.

b) Such a current demands the use of a large size transistor, which limits the constructional density of the memory.

c) The amplitude of the variation in resistance obtained is very low (2–3%), which limits the output voltage.

d) For MRAM applications, the document referenced mentions three conductor levels and two voltage sources. A central conductor is intended to collect the polarised current used for reversal of the free layer. The device is therefore complex. The present invention is therefore aimed at overcoming these disadvantages.

PRESENTATION OF THE INVENTION

To this end, the invention proposes to use a means for polarising the spin of the electrons in a direction perpendicular to the common magnetisation plane of the stack and, essentially, to the magnetisation in the free layer. This magnetisation will therefore rotate around the polarisation direction of the spins, enabling different magnetic states to be attributed to the device.

More precisely, the invention therefore concerns a magnetic device consisting of:

a first magnetic layer known as the "anchored" layer, which exhibits a fixed magnetisation direction, a second magnetic layer known as the "free" layer, which exhibits a variable magnetisation direction, an insulating layer which separates the anchored and free layers, means for passing a current of electrons through and perpendicular to the layers, means for polarising the spin of those electrons, characterised in that the means for polarising the spin of a majority of the electrons include at least one magnetic layer whose magnetisation is perpendicular to the plane of the free layer magnetisation, this polarising magnetic layer being separated from the free layer by a non-magnetic conducting layer.

In one design, the magnetic polarising layer is a layer whose magnetisation is perpendicular to the plane of the layers, and in which the magnetisation of the anchored and free layers is located in the plane of the said layers, the spin of the electrons acting on the free layer magnetisation then being polarised perpendicularly to the plane of the free layer and the magnetisation of the latter rotating within the plane of the said free layer.

In another design, the magnetic polarising layer is a layer whose magnetisation is parallel to the plane of the layers, and the magnetisation of the anchored and free layers is located in a plane perpendicular to the said layers, the spin of the electrons acting on the magnetisation of the free layer then being polarised parallel to the said layer and its magnetisation rotating within a plane perpendicular to the said free layer.

The present invention also concerns a memory consisting of a matrix of memory cells addressable via addressing rows and columns, characterised in that each memory cell consists of a magnetic device as has just been described and by a means for current switching, connected in series with the magnetic device, each magnetic device being connected to an addressing row and each switching device being connected to an addressing column.

The present invention also concerns a process for writing data into a device as described above, characterised in that:
- a current of electrons is passed through the device and perpendicularly to the plane of the layers, the said polarising means polarise the electrons in a direction perpendicular to the plane of the free layer magnetisation, the said magnetisation then rotating within this plane,
- the said current is then cut off when the magnetisation of the free layer is either parallel or anti-parallel to the anchored layer magnetisation.

BRIEF DESCRIPTION OF THE DIAGRAMS

FIGS. 1A and 1B, already described, show a known device for writing and reading binary data in a tunnel effect magnetic junction using external magnetic fields;

DESCRIPTION OF THE PARTICULAR DESIGNS

Figure 1A:
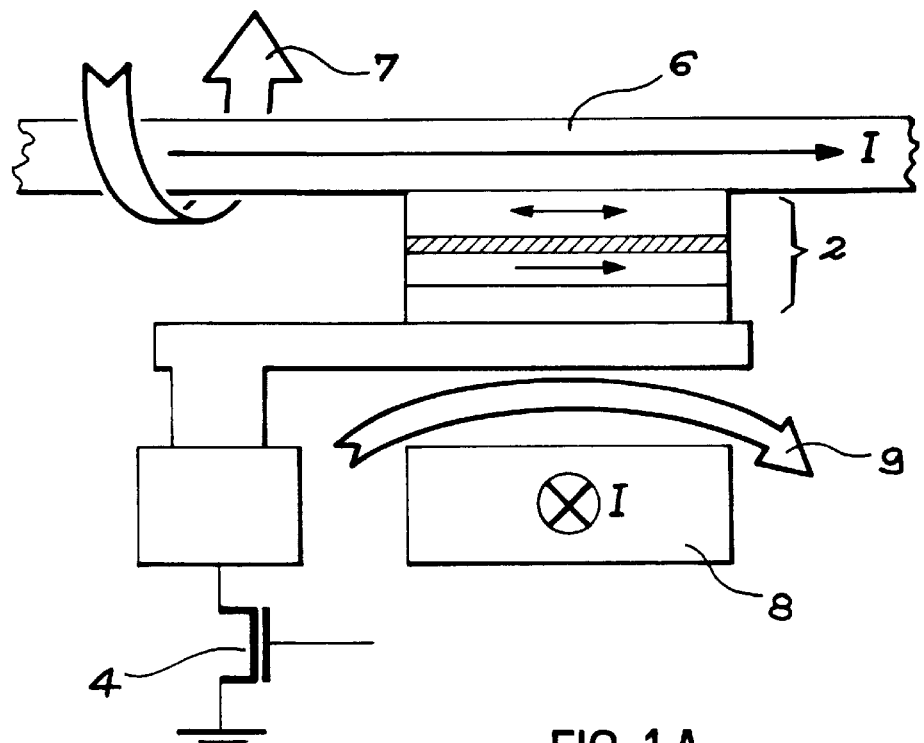
Figure 1B:
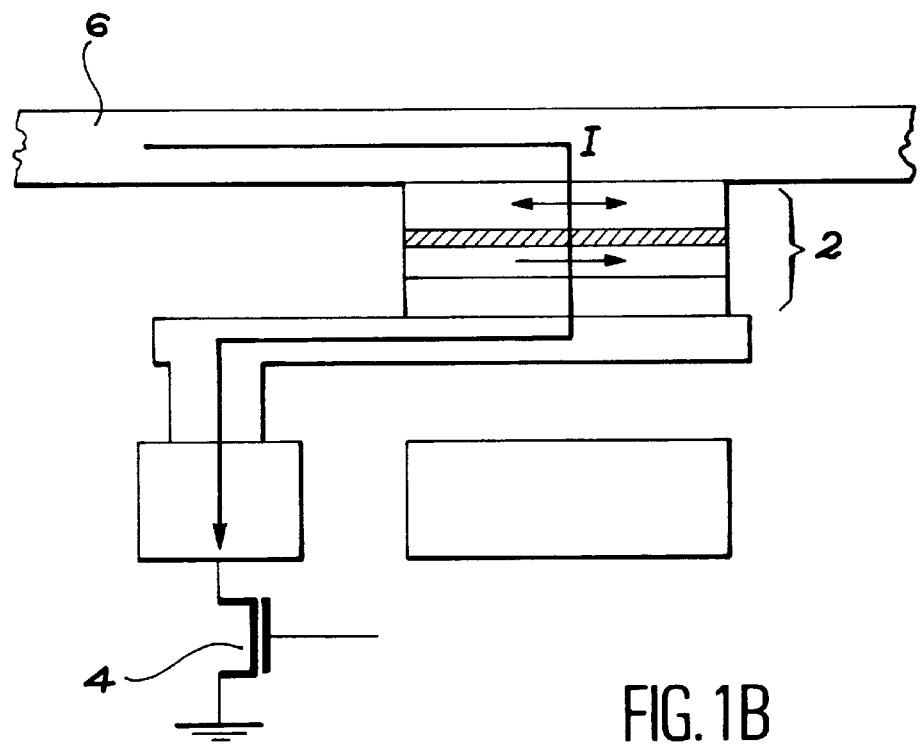

Regarding the spin polarisation phenomenon for electrons circulating in tunnel junction devices, it is useful to recall the following principles. An electric current flowing through a conductor consists of electrons whose spin has no particular reason to be oriented in any specific direction. However, if this current passes through a magnetic layer having a particular magnetisation, the spins will be oriented by magnetic moment exchange phenomena, such that the electrons leave the layer with a polarised spin. Such a layer (or set of layers) thus constitutes a "polariser". This phenomenon may act both in transmission (through a layer) and in reflection (from a layer), according to the direction of the current flow. It may also act in the reverse direction by preferentially allowing electrons to pass which have a spin which is polarised in a certain direction. The function of the layer in such case is to behave as an analyser.

Referring now to the first design of the invention, this consists in using a tunnel junction formed by two magnetic layers located on either side of an insulating layer. One of the layers has its magnetisation direction anchored by exchange coupling with an anti-ferromagnetic layer: this is the anchored layer. The second layer has free magnetisation. It can only rotate within the plane of the layer due to the demagnetisation field present in the layer. The device also includes a polariser consisting of a perpendicular magnetisation system.

To write, a current is passed through the junction which is small enough not to cause reversal of the magnetisation of the free layer (such reversal could occur but only with very high current densities which would destroy the junction). The electrons reflected or transmitted by the polariser, are polarised with a spin direction perpendicular to the planes of the layers. These spin electrons thus polarised cause a continuous rotation of the free layer magnetisation within the plane of the layer. If the free layer were magnetically isotropic, a magnetisation component along an axis parallel to the layer would be subject to a sinusoidal temporal variation. However, the free layer is not isotropic and exhibits uniaxial magnetic anisotropy, which generates an easy magnetisation axis (with two possible directions). For such an anisotropic layer, the variations in a magnetisation component are distorted and exhibit two lands of equal duration corresponding to the easy magnetisation directions. The polarisation of the electron spins induced by the anchored layer then favours one of the two magnetisation directions of the free layer, therefore increasing one of the two lands according to the direction of the current. This increase in the duration of one of the lands reduces the risk of error when writing with current pulses. Using a short duration current pulse of a given duration, it is therefore possible to select one of these lands in order to give the free layer a magnetisation direction which is either parallel or anti-parallel to the magnetisation direction of the anchored layer immediately adjacent to the insulating layer.

Figure 2:
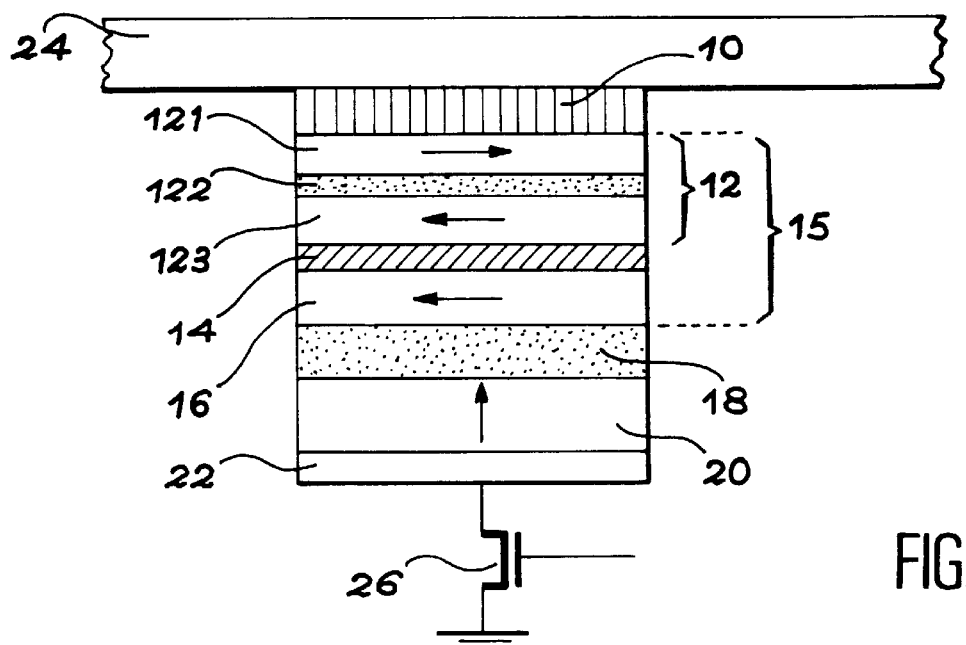
FIG. 2 shows, in section, a first design for a device in accordance with the invention.

This first design is illustrated in FIG. 2. The device shown includes an anti-ferromagnetic layer (10), a tri-layer stack (12) consisting of two magnetic layers (121, 123) with anti-parallel planar magnetisation, separated by a non-magnetic conducting layer. This stack constitutes the anchored layer. The device also includes an insulating layer (14), and a magnetic free layer (16). The assembly (12), (14), (16) constitutes a magnetic tunnel junction (15).

The device is completed by a metallic separating layer (18) and a magnetic polarising layer (20), whose magnetisation is perpendicular to the plane of the layer. This layer (20) may consist of a stack of layers, made for example of Fe/Pt or Fe/Pd or Co/Pt, or Co/Pd, or Co/Au, etc. or of their direct alloys. The polarisation layer is mounted on a conducting substrate (22). The assembly of this stack is inserted between a current supply line (24) and a current switching device, in this case a transistor (26).

Figure 3A:
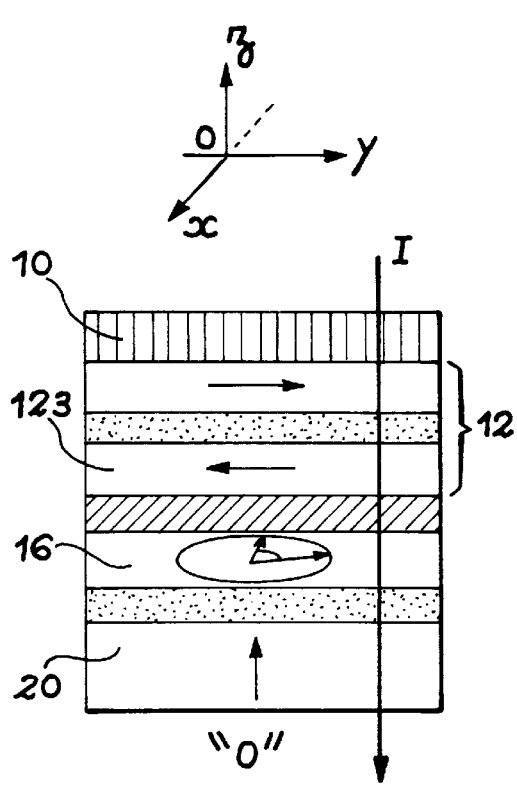
FIGS. 3A and 3B show the orientations of the magnetisation in the different layers according to whether a "0" or a "1" has been written, for this first design.
Figure 3B:
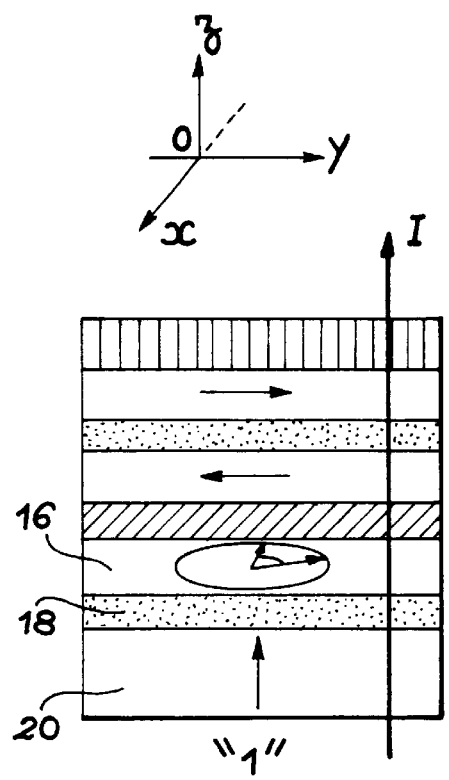

For the electrons transmitted through layer (20), or reflected by it, the spin direction will be oriented parallel to the magnetisation of the layer, i.e. perpendicular to the plane of the various layers of the junction (15) and in particular to the free layer (16). The magnetisation of this layer when subjected to this current of polarised electrons, will rotate within the plane of the layer, without being able to align itself with the spin direction due to the demagnetisation field exerted within the layer. FIGS. 3A and 3B show a symbolic representation of this rotation. A tri-rectangular trihedron Oxyz is used to identify the different directions, where axis Oz is perpendicular to the plane of the layers.

Figure 4A:
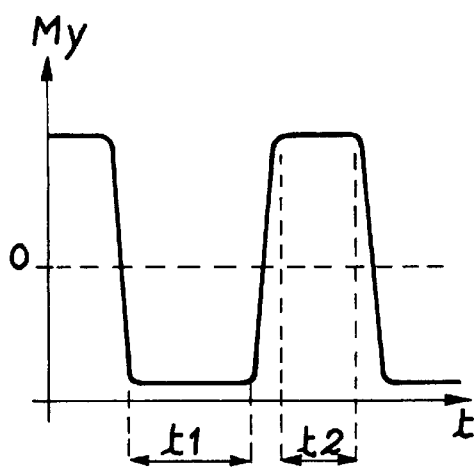
FIGS. 4A and 4B show the variations of the magnetisation component in relation to axis Oy parallel to the plane of the layers for these two cases ("0" and "1")
Figure 4B:
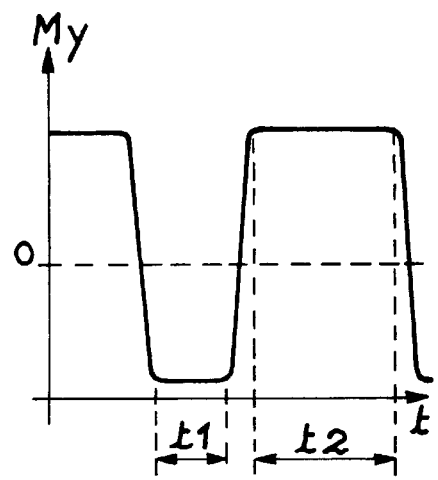

If the current is positive (FIG. 3A) but of density less than the critical density, the polarisation induced by layer (123) will not be able to reverse the magnetisation of layer (16) but will favour a magnetisation direction along (−y). In the magnetisation rotation described above, a difference is observed between the width of the steps with an increase in the duration of the lands according to (−y) and a decrease according to (+y). This is shown in FIG. 4A with durations $t_1$ and $t_2$ for the lands where $t_1 > t_2$. By passing a pulsed current of carefully chosen duration through the junction, it is possible to favour writing of a binary element which can be written "0". If the direction of the current is reversed (FIG. 3B), the favoured magnetisation direction is reversed and the imbalance in the duration of the lands is reversed also (FIG. 4B) where $t_1 < t_2$. This will then favour writing "1". This gives either My>0 (anti-parallelism in the case illustrated), or My<0 (parallelism).

The advantages of this device are a low current density and a high writing speed because the rotation within the plane is much faster than magnetisation reversal, as found in the previous technology, which required a large number of precession oscillations.

For reading, the current pulse is of lower duration and/or intensity than the writing pulse, in order to be able to read the magnetic state of the device without danger of overwriting it.

In the second design, the device includes a tunnel junction formed of a barrier of oxide sandwiched between two perpendicular magnetisation systems. One of the perpendicular magnetisation systems is in exchange interaction with an anti-ferromagnetic layer in order to fix its magnetisation direction. It fulfils the double role of polariser (in writing) and analyser (in writing and reading). The second perpendicular magnetisation system is free to orient its magnetisation in the direction of the polarised spins. The device additionally includes a planar magnetisation polariser formed by a thick magnetic layer or a tri-layer stack where the thickness of the two magnetic layers is different. The addition of a planar magnetisation polariser induces a magneto-static coupling field in the plane of the layers, which tends to reduce the effective perpendicular anisotropy and therefore enables the critical current density to be reduced. The planar polariser generates a continuous rotation of the free layer magnetisation in a plane perpendicular to the magnetisation of the polariser. The perpendicular polariser favours a stable magnetic state and therefore enables selection of the binary information to be written ("0" or "1"). In write mode, a pulsed current, of controlled duration, is passed through the junction to cause a reversal of the free layer magnetisation. Through these two polarisers, the writing current is lowered and the writing time is considerably reduced. In read mode, the pulsed current passing through the junction is of shorter duration than for writing.

Figure 5:
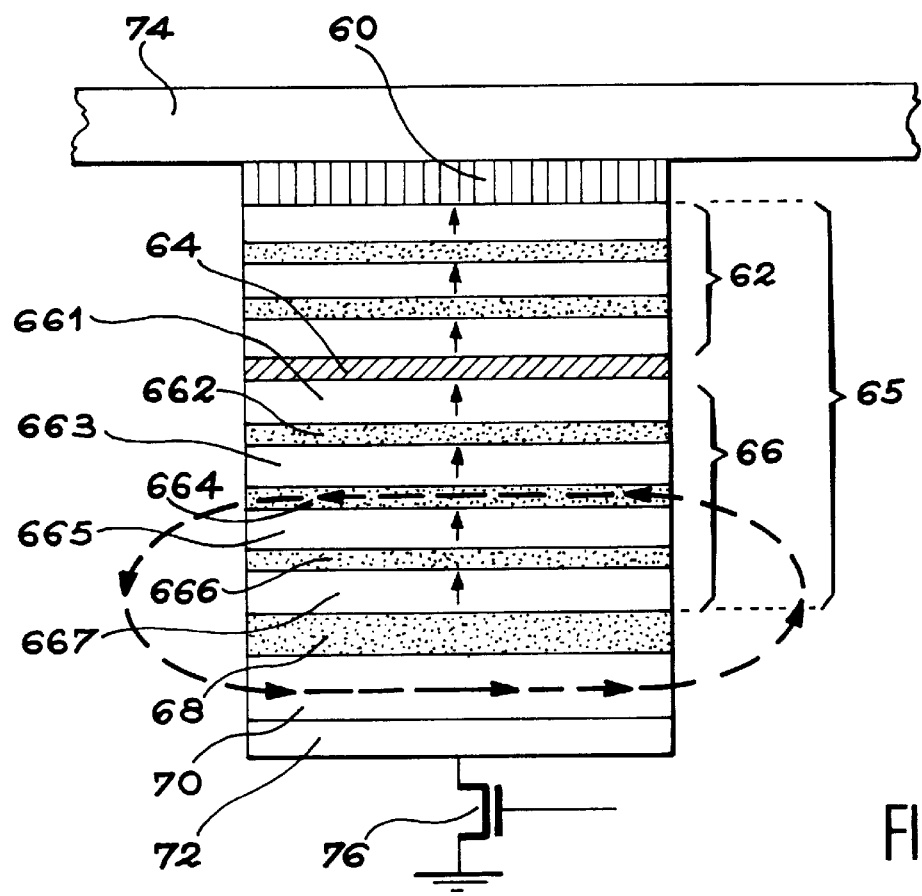
FIG. 5 shows, in section, a second design for a device in accordance with the invention.

This second design is illustrated in FIG. 5. The design shown consists of an anti-ferromagnetic layer (60), a stack (62) of alternate magnetic and non-magnetic layers, an insulating layer (64) and a stack (66) of alternate magnetic and non-magnetic layers. Stack (62) constitutes the anchored layer whose magnetisation is perpendicular to the plane of the layers. The assembly of stacks (62) and (66) separated by the insulating layer (64) constitutes a magnetic tunnel junction (65). The device also includes a conducting non-magnetic layer (68) and a magnetic polarising layer (70) mounted on a conducting substrate (72). The assembly of this stack is located between a current supply line (74) and a current switching device, in this case a transistor (76).

Figure 6A:
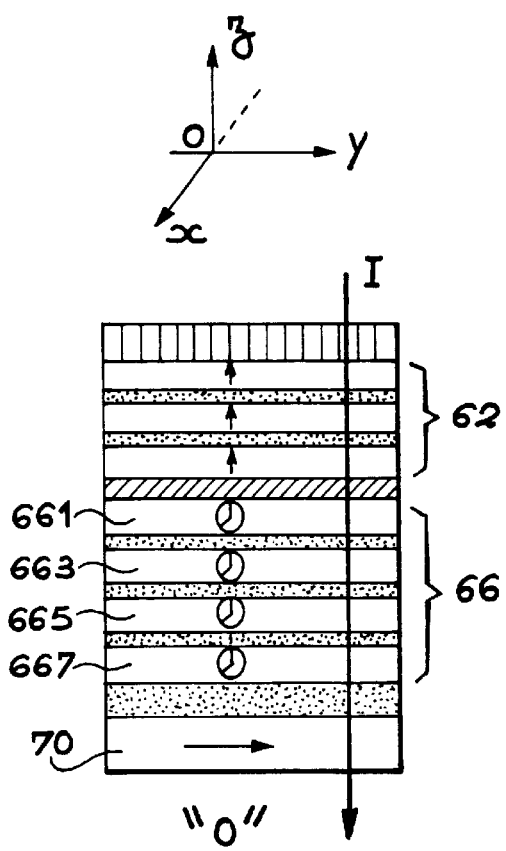
FIGS. 6A and 6B show the orientations of the magnetisation in the different layers according to whether a "0" or a "1" has been written, for this second design.
Figure 6B:
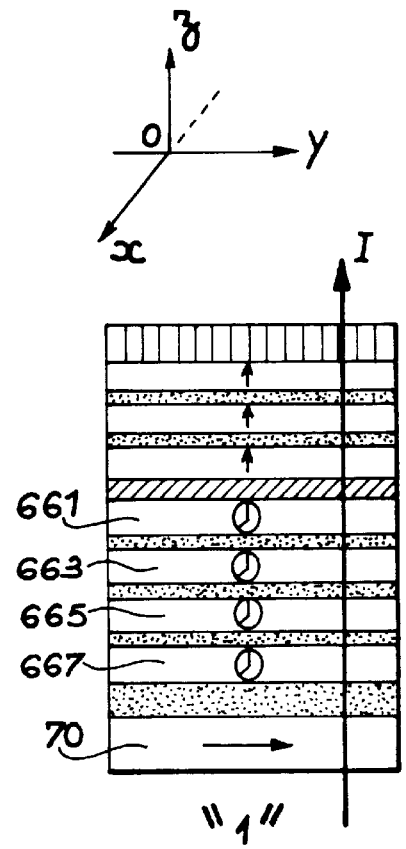

FIGS. 6A and 6B show the mechanism for writing a "0" and "1" and the rotation of the magnetisation within the free layer (66), and more particularly in the sub-layers (661), (663), (665) and (667) which constitute this layer. In FIG. 6A, the current flows from top to bottom and in FIG. 6B from bottom to top.

Figure 7A:
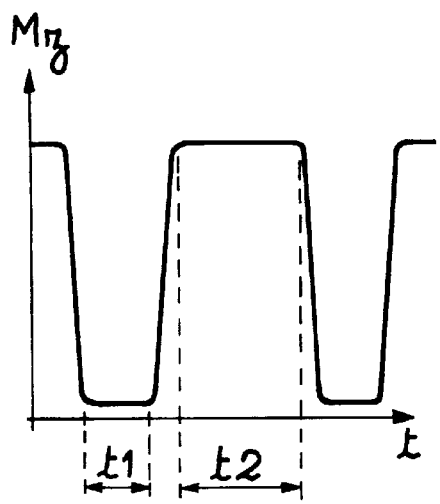
FIGS. 7A and 7B show the variations in the magnetisation component along axis Oz perpendicular to the plane of the layers for these two cases ("0" and "1")
Figure 7B:
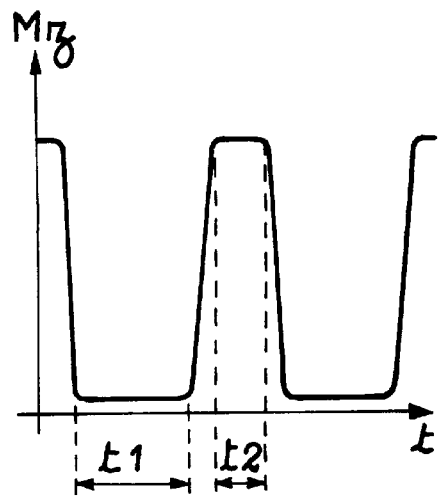
Figure 8:
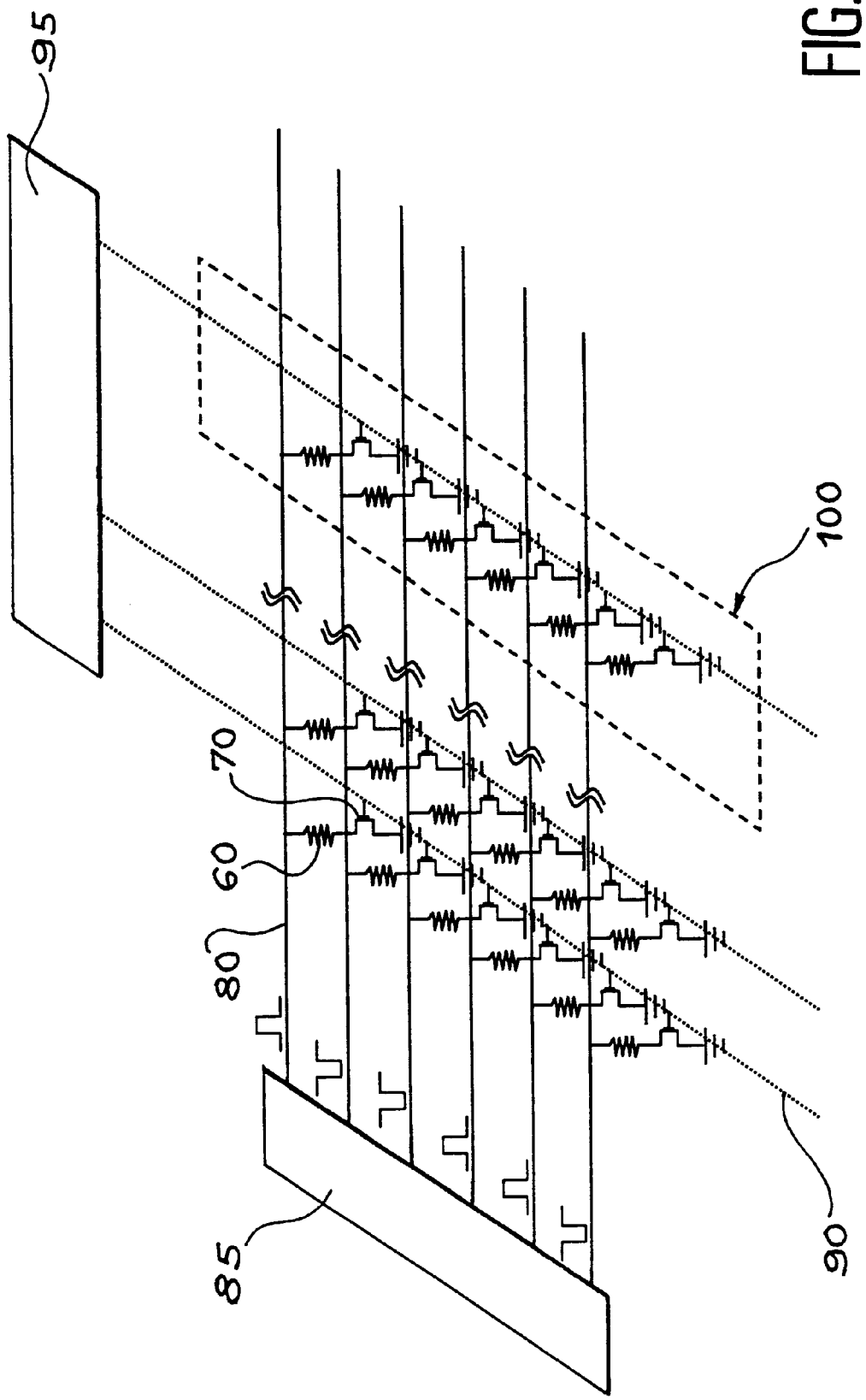
FIG. 8 is a schematic representation of a memory using a matrix of devices in accordance with the invention.

FIGS. 7A and 7B show the variations in component Mz of the magnetisation along the Oz axis. In FIG. 7A, the parallelism of the magnetisation corresponds to the longest land and in FIG. 7B, this corresponds on the other hand to anti-parallelism.

The role of the planar magnetisation layer (70) is twofold:
i) to polarise the electrons with a polarisation axis in the plane of the layers;
ii) to generate magneto-static coupling in the plane of the layer (66) in order to reduce the effective anisotropy of the layer and to facilitate rotation of the magnetisation of the layer (66) around the polarisation axis of the electrons accumulated or transmitted by layer (70).

The material used for layer (70) should preferably be a thick layer of a transition metal (Fe, Ni or Co) or an alloy of the transition metals. The direction of its magnetisation cannot vary in the presence of current, since the density required for such variation is much higher than that used for writing or reading. The thickness must be chosen in order to control the strength of the magneto-static coupling with layer (66) and to optimise the polarisation of the electrons. Moreover, its great thickness enables the magnetisation direction to be fixed (by its coercive field) without using the exchange layer.

The writing process uses the principles already described for the first design and employs the uniaxial magnetic anisotropy of the free layer. To write a "0", a positive current is passed through the system (Cf. FIG. 6A). The electrons which accumulate on layer (70) cause a rotation of the magnetisation of layer (66). Component Mz would exhibit a purely sinusoidal characteristic in the absence of anisotropy. Because of the uniaxial magnetic anisotropy of the free layer, the variations in a magnetisation component exhibit two equal lands which correspond to the two easy magnetisation directions. The polarisation of the spin of the electrons induced by the anchored layer (62) favours the magnetisation direction according to (+z): the land corresponding to Mz>0 is extended, which favours the magnetic state "0". By appropriate choice of the duration of the writing pulse, state "0" can therefore be selected. Monitoring of the state is performed by reading the voltage at the terminals of the junction and comparison with a reference cell. To write a "1", the process is identical but a negative current is passed through the system (FIG. 6B). The state Mz<0 is then favoured at the expense of Mz>0. Reading of the magnetic state of a device is achieved using a low density pulsed current, whose duration is less than the duration of the lands.

The two designs described above may be compared in the table below, where:

t is the thickness of the magnetic layer to be reversed,

Ms is the magnetisation at saturation of the layer to be reversed, in the case of CoFe (Ms=1500 emu/cc), Hk is the anisotropy of the magnetic layer to be reversed, Jc (write) is the current density for writing a memory cell, $RA_{max}$ is the product of the resistance by the surface area of the tunnel junction, defined such that the write voltage does not exceed 0.6 V, Jc (read) is the current density for a reading voltage of 0.3 V with $RA_{max}$, $a_{min}$ is the minimum size of one side of the memory cell (for a square memory cell) before reaching the superparamagnetic limit.

The value of $a_{min}$ is calculated using the following formula:

$$a_{\min} = \sqrt{\frac{84 k_B T}{M_s H_k t}}$$

in which the value 84 is calculated by considering a 100-year service life for the memory at a temperature of 100° C.

| Design | 1 | 2 |
|---|---|---|
| t (nm) | 5 | 2 |
| Ms (emu/cc) | 1500 | 1500 |
| Effective Hk (G) | 40 | 100 |
| Jc (write) (A/cm$^2$) | 1.6E +05 | 1.6E +05 |
| $RA_{max}$ (ohm · $\mu$m$^2$) | 375 | 375 |
| Jc (read) (A/cm$^2$) | 8E +05 | 8E +04 |
| $a_{min}$ (micron) | 0.12 | 0.12 |

It can be seen from this table, that with the invention, it is possible to achieve low write current densities, compatible with reasonable RA product junctions (>100 Ω.$\mu$m$^2$). Such RA products may be obtained, either by plasma oxidation, or and preferably by natural oxidation in-situ.

Finally, FIG. 7 shows a memory formed of a matrix of memory cells addressable by rows and columns. Each memory cell includes a device in accordance with the invention, with a stack of layers symbolised by a resistor (60) and a switching device (70) consisting of a transistor. Each stack is connected to an addressing row (80) and the base (or gate) of the transistor to an addressing column (90). The rows (80) are called "bit lines" and the columns are called "word (or digit) lines". The rows (80) are connected to the outputs of a row addressing circuit (85) and the columns (90) to the outputs of a column addressing circuit (95).

When a sequence of bits is to be written (e.g. 100110), the column address is called up by an impulse suitable for opening the transistors in the column concerned and a current pulse of appropriate polarity is sent to each line (in the example taken, respectively +--++-). All the bits are thus written in the column of the memory simultaneously.

This multiple addressing process is made possible by the invention since, as explained in the introduction, a memory cell may be written in without any danger of interference with the adjacent cells or unintended writing in the vicinity.

Writing of the entire memory may also be performed in columns.

Somewhere in the memory, for example in the centre, there is a reference column (100), which enables multiple reading. When a reading current flows in the memory cells of a column (90), the read voltage of each memory cell is compared with the voltage read from the memory cell in the reference column belonging to the same row.

This writing and reading mechanism in columns considerably reduces the cycle time of the memory.

What is claimed is:

1. Magnetic device comprising:
    a first magnetic layer having a fixed magnetisation direction;
    a second magnetic layer having a variable magnetisation direction;
    an insulating or semi-conducting layer which separates the first magnetic layer from the second magnetic layer;
    means for passing a current of electrons through and perpendicular to the first and second magnetic layers; and
    means for polarising the spin of the electrons including at least one magnetic layer having a magnetisation perpendicular to the plane of the magnetisation of the second magnetic layer, the magnetic polarisation layer being separated from the second magnetic layer by a non-magnetic conducting layer.

2. Device in accordance with claim 1, wherein
    the magnetic polarisation layer has a magnetisation perpendicular to the plane of the first and second magnetic layers, and
    wherein the magnetisation of the first and second magnetic layers are located within the plane of the first and second magnetic layers, the spin of the electrons acting on the magnetisation of the second magnetic layer, thereby rotating the magnetisation of the second magnetic layer from a direction perpendicular to the plane of the second magnetic layer within the plane of the second magnetic layer.

3. Device in accordance with claim 2, wherein the magnetic polarisation layer comprises a stack of layers.

4. Device in accordance with claim 3, wherein the stack of layers comprises alternate layers of materials taken from the group consisting of Fe, Pt, Pd, Co, Au, and their alloys.

5. Device in accordance with claim 1, wherein the magnetic polarisation layer is a layer having a magnetisation parallel to the plane of the first and second magnetic layers, and wherein the magnetisation of the first and second magnetic layers is located in a plane perpendicular to the first and second magnetic layers, the spin of the electrodes acting on the second magnetic layer then being polarised parallel to the second layer, thereby causing the magnetisation of the second magnetic layer to rotate in a plane perpendicular to the second magnetic layer.

6. Device in accordance with claim 5, wherein the second magnetic layer exhibits anisotropy in a plane perpendicular to the second magnetic layer.

7. Device in accordance with claim 5, wherein the first magnetic layer is magnetised perpendicularly to the first magnetic layer.

8. Device in accordance with claim 5, wherein the magnetic polarisation layer is made of a material taken from the group consisting of Fe, Ni, Co and their alloys.

9. Device in accordance with claim 5, in which the second magnetic layer comprises plural magnetic layers separated by conducting non-magnetic layers.

10. Memory comprising a matrix of memory cells addressable in rows and columns, wherein each memory cell comprises:

a magnetic device comprising:
  a first magnetic layer having a fixed magnetisation direction,
  a second magnetic layer having a variable magnetisation direction,
  an insulating or semi-conducting layer which separates the first magnetic layer from the second magnetic layer,
  means for passing a current of electrons through and perpendicular to the first and second magnetic layers,
  means for polarising the spin of the electrons including at least one magnetic layer having a magnetisation perpendicular to the plane of the magnetisation of the second magnetic layer, the magnetic polarisation layer being separated from the second magnetic layer by a non-magnetic conducting layer; and
a current switching device connected in series with the magnetic device, each magnetic device being connected to an addressing row and each switching device to an addressing column.

11. Memory in accordance with claim 10, further comprising a reference column and means for comparing the voltage read at the terminals of the magnetic device located at the intersection between a row and a column, and the voltage read at the terminals of the magnetic device located on the same row but in the reference column.

12. Data writing process in a magnetic device, wherein said magnetic device comprises a first magnetic layer having a fixed magnetisation direction, a second magnetic layer having a variable magnetisation direction, an insulating or semi-conducting layer which separates the first magnetic layer from the second magnetic layer, means for passing a current of electrons through and perpendicular to the first and second magnetic layers, and means for polarising the spin of the electrons including at least one magnetic layer having a magnetisation perpendicular to the plane of the magnetisation of the second magnetic layer, the magnetic polarisation layer being separated from the second magnetic layer by a non-magnetic conducting layer, wherein
  a current of electrons is passed through the device and perpendicularly to a plane of the first and second magnetic layers, the polarising means polarising the electrons in a direction perpendicular to the plane of the magnetisation of the second magnetic layer, the magnetisation then rotating within the plane of said second magnetic layer, and
  the current is cut off when the magnetisation of the second magnetic layer is either parallel or anti-parallel to the magnetisation of the first magnetic layer.

13. Magnetic device comprising:
a first magnetic layer having a fixed magnetisation direction;
a second magnetic layer having a variable magnetisation direction;
an insulating or semi-conducting layer which separates the first magnetic layer from the second magnetic layer, and covers an entire surface of the first magnetic layer;
a device configured to pass a current of electrons through and perpendicular to the first and second magnetic layers;
at least one magnetic layer having a magnetisation perpendicular to the plane of the magnetisation of the second magnetic layer, the magnetic polarisation layer being separated from the second magnetic layer by a non-magnetic conducting layer.

14. Magnetic device comprising:
a first magnetic layer having a fixed magnetisation direction;
a second magnetic layer having a variable magnetisation direction;
an insulating or semi-conducting layer which separates the first magnetic layer from the second magnetic layer;
a device configured to pass a current of electrons through and perpendicular to the first and second magnetic layers;
at least one magnetic layer having a magnetisation perpendicular to the plane of the magnetisation of the second magnetic layer, the magnetic polarisation layer being separated from the second magnetic layer by a non-magnetic conducting layer,
wherein the magnetic polarisation layer has a magnetisation perpendicular to the plane of the first and second magnetic layers, and
wherein the magnetisation of the first and second magnetic layers are located within the plane of the first and second magnetic layers, the spin of the electrons acting on the magnetisation of the second magnetic layer, thereby rotating the magnetisation of the second magnetic layer from a direction perpendicular to the plane of the second magnetic layer within the plane of the second magnetic layer.

15. Device in accordance with claim 14, wherein the magnetic polarisation layer comprises a stack of layers.

16. Device in accordance with claim 15, wherein the stack of layers comprises alternate layers of materials taken from the group consisting of Fe, Pt, Pd, Co, Au, and their alloys.

17. Magnetic device comprising:
a first magnetic layer having a fixed magnetisation direction;
a second magnetic layer having a variable magnetisation direction;
an insulating or semi-conducting layer which separates the first magnetic layer from the second magnetic layer;
a device configured to pass a current of electrons through and perpendicular to the first and second magnetic layers; and
at least one magnetic layer having a magnetisation perpendicular to the plane of the magnetisation of the second magnetic layer, the magnetic polarisation layer being separated from the second magnetic layer by a non-magnetic conducting layer,
wherein the magnetic polarisation layer is a layer having a magnetisation parallel to the plane of the first and second magnetic layers, and wherein the magnetisation of the first and second magnetic layers is located in a plane perpendicular to the first and second magnetic layers, the spin of the electrodes acting on the second magnetic layer then being polarised parallel to the second layer, thereby causing the magnetisation of the second magnetic layer to rotate in a plane perpendicular to the second magnetic layer.

18. Device in accordance with claim 17, wherein the second magnetic layer exhibits anisotropy in a plane perpendicular to the second magnetic layer.

19. Device in accordance with claim 17, wherein the first magnetic layer is magnetised perpendicularly to the first magnetic layer.

20. Device in accordance with claim 17, wherein the magnetic polarisation layer is made of a material taken from the group consisting of Fe, Ni, Co and their alloys.

21. Device in accordance with claim 17, in which the second magnetic layer comprises plural magnetic layers separated by conducting non-magnetic layers.

22. Memory comprising a matrix of memory cells addressable in rows and columns, wherein each memory cell comprises:
    a magnetic device comprising:
        a first magnetic layer having a fixed magnetisation direction,
        a second magnetic layer having a variable magnetisation direction,
        an insulating or semi-conducting layer which separates the first magnetic layer from the second magnetic layer,
        device configured to pass a current of electrons through and perpendicular to the first and second magnetic layers,
        at least one magnetic layer having a magnetisation perpendicular to the plane of the magnetisation of the second magnetic layer, the magnetic polarisation layer being separated from the second magnetic layer by a non-magnetic conducting layer; and
    a current switching device connected in series with the magnetic device, each magnetic device being connected to an addressing row and each switching device to an addressing column.

23. Memory in accordance with claim 22, further comprising a reference column and a device configured to compare the voltage read at the terminals of the magnetic device located at the intersection between a row and a column, and the voltage read at the terminals of the magnetic device located on the same row but in the reference column.

24. Data writing process in a magnetic device, wherein said magnetic device comprises a first magnetic layer having a fixed magnetisation direction, a second magnetic layer having a variable magnetisation direction, an insulating or semi-conducting layer which separates the first magnetic layer from the second magnetic layer, a device configured to pass a current of electrons through and perpendicular to the first and second magnetic layers, and at least one magnetic layer having a magnetisation perpendicular to the plane of the magnetisation of the second magnetic layer, the magnetic polarisation layer being separated from the second magnetic layer by a non-magnetic conducting layer, wherein
    a current of electrons is passed through the device and perpendicularly to a plane of the first and second magnetic layers, the magnetic polarisation layer polarising the electrons in a direction perpendicular to the plane of the magnetisation of the second magnetic layer, the magnetisation then rotating within the plane of said second magnetic layer,
    the current is cut off when the magnetisation of the second magnetic layer is either parallel or anti-parallel to the magnetisation of the first magnetic layer.

* * * * *